United States Patent
Gu-Stoppel et al.

(10) Patent No.: US 9,399,573 B2
(45) Date of Patent: Jul. 26, 2016

(54) DEVICE COMPRISING A SPRING AND AN ELEMENT SUSPENDED THEREON, AND METHOD FOR MANUFACTURING SAME

(71) Applicant: Fraunhofer-Gesellschaft zur Foerderung der angewandten Forschung e.V., Munich (DE)

(72) Inventors: Shanshan Gu-Stoppel, Itzehoe (DE); Hans Joachim Quenzer, Itzehoe (DE); Ulrich Hofmann, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/280,154

(22) Filed: May 16, 2014

(65) Prior Publication Data
US 2014/0339658 A1 Nov. 20, 2014

(30) Foreign Application Priority Data
May 17, 2013 (DE) .................... 10 2013 209 238

(51) Int. Cl.
 H01L 29/84 (2006.01)
 B81B 3/00 (2006.01)
 B81C 1/00 (2006.01)

(52) U.S. Cl.
 CPC ............ *B81B 3/0027* (2013.01); *B81B 3/0029* (2013.01); *B81C 1/00357* (2013.01); *B81C 1/00626* (2013.01); *H01L 29/84* (2013.01); *B81B 2201/042* (2013.01); *B81B 2203/0109* (2013.01); *B81B 2203/0163* (2013.01); *B81C 2201/014* (2013.01)

(58) Field of Classification Search
CPC  B81B 3/0027; B81B 3/0029; B81C 1/00626; H01L 29/84
See application file for complete search history.

(56) References Cited

U.S. PATENT DOCUMENTS

| | | | |
|---|---|---|---|
| 8,687,255 B2 | 4/2014 | Finkbeiner et al. | |
| 2002/0054729 A1* | 5/2002 | Berg | G02B 6/3578 385/18 |
| 2003/0035192 A1* | 2/2003 | Mizuno | B01D 53/885 359/290 |
| 2003/0090172 A1* | 5/2003 | Lee | B81B 3/004 310/309 |
| 2003/0117679 A1* | 6/2003 | Wood | G02B 26/0841 359/226.1 |
| 2003/0227700 A1* | 12/2003 | Mizuno | G02B 26/0841 359/877 |
| 2004/0114942 A1* | 6/2004 | Yee | G02B 6/266 398/214 |
| 2004/0232107 A1* | 11/2004 | Kouma | G02B 26/0841 216/41 |
| 2006/0180883 A1 | 8/2006 | Kouma et al. | |
| 2008/0169522 A1* | 7/2008 | Arima | H01L 21/2007 257/415 |
| 2009/0303563 A1* | 12/2009 | Drabe | G02B 26/0833 359/214.1 |
| 2010/0067084 A1* | 3/2010 | Hagihara | G02B 26/0841 359/221.2 |
| 2011/0136283 A1* | 6/2011 | Gritters | H02N 1/006 438/50 |
| 2011/0188104 A1* | 8/2011 | Tachibana | B81B 3/0051 359/199.2 |
| 2013/0044363 A1 | 2/2013 | Reinmuth | |

FOREIGN PATENT DOCUMENTS

| | | |
|---|---|---|
| DE | 102008041178 | 2/2010 |
| DE | 102011081002 | 2/2013 |
| EP | 2100848 | 9/2009 |

* cited by examiner

*Primary Examiner* — Michele Fan
(74) *Attorney, Agent, or Firm* — Perkins Coie LLP; Michael A. Glenn

(57) ABSTRACT

The invention relates to an MEMS structure with a stack made of different layers and a spring-and-mass system varying in its thickness which is formed of the stack, and wherein, starting from a back side of the stack and the substrate, at laterally different positions, the substrate while leaving the first semiconductor layer, or the substrate, the first etch-stop layer and the first semiconductor layer are removed, and to a method for manufacturing such a structure.

5 Claims, 14 Drawing Sheets

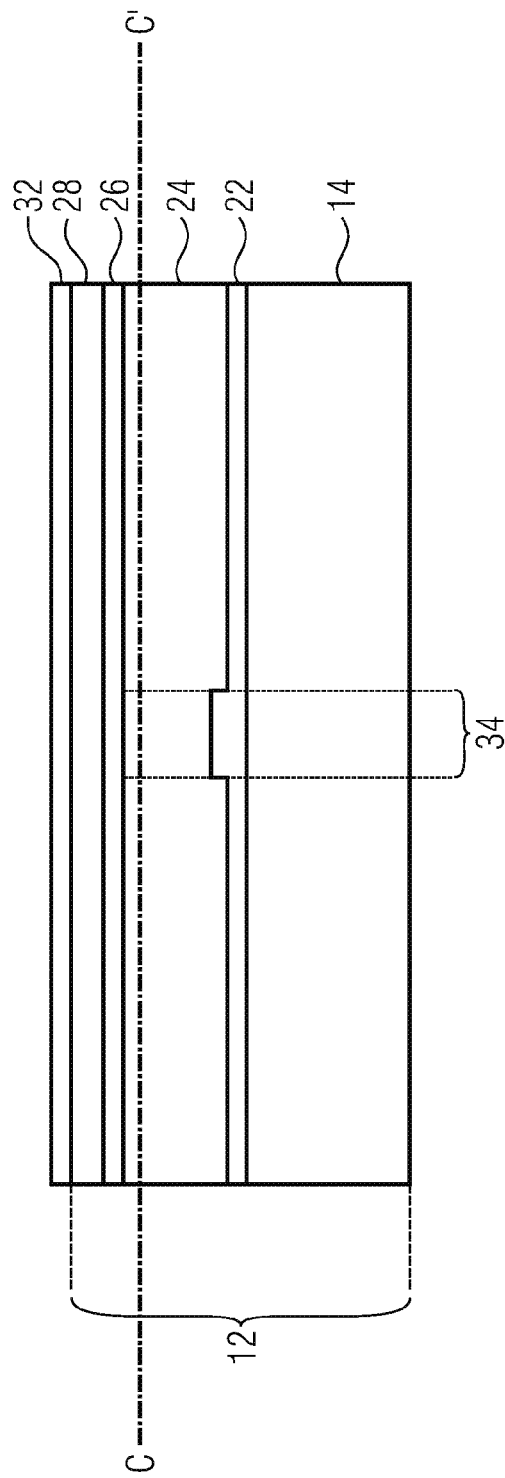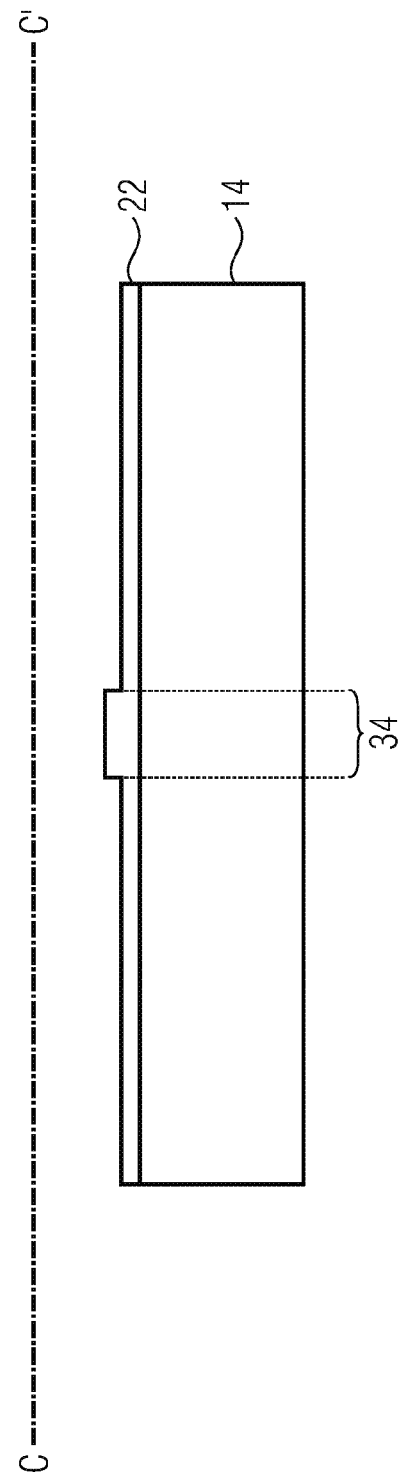

DEVICE COMPRISING A SPRING AND AN ELEMENT SUSPENDED THEREON, AND METHOD FOR MANUFACTURING SAME

CROSS-REFERENCE TO RELATED APPLICATION

This application claims priority from German Patent Application No. 102013209238.5, which was filed on May 17, 2013, and is incorporated herein by reference in its entirety.

BACKGROUND OF THE INVENTION

The present invention relates to a device comprising a spring formed of a stack and an element suspended via the spring, and to a method for manufacturing same from a stack consisting of a substrate and semiconductor layers.

In most piezoelectric microscanners, the micromirror is driven by actuators consisting of a piezoelectric layer enclosed by two electrodes and an underlying carrier layer, functioning like a bending beam. The piezoelectric actuators arranged at two opposite outer sides of the microscanner are driven in opposite phases such that the mirror arranged between the actuators and suspended at the actuators via portion springs vibrates in a torsion mode of a spring-and-mass system formed by the mirror, the actuators and the springs. Different layer thicknesses are necessitated for setting up such a system in order to realize the respective functions of the different components.

A small layer thickness of the actuators is usually sought so as to allow large deflections. With a constant force, the deflection of a bending beam increases with a decreasing layer thickness. However, the actuators usually are not to fall below a certain layer thickness since actuators which are too thin exhibit a very low resonant frequency and poor structural stability.

The mirror of the microscanner necessitates a certain minimum thickness so as to minimize dynamic deformations of the reflection area of the mirror which are excited by the dynamic excitation of the actuators.

The layer thickness of the torsion springs at which the mirror is suspended usually is determined very precisely in order to find a compromise between the material stress to be minimized when exerting a distortion and a high resonant frequency desired. While an increased layer thickness of the torsion springs desirably increases the resonant frequency of the spring-and-mass system, the material stress induced by the deformation of the torsion springs during operation is also rising, which may result in a premature breakdown of the microscanner.

Stiffening springs between the torsion springs and the actuators are to be sufficiently thick in order to avoid undesired deformations at these locations, induced by the actuators. The stiffening springs may comprise a greater thickness than the actuators.

Consequently, an MEMS (Micro Electro Mechanical System) structure in the form of a microscanner exhibits different regions of layer thicknesses which ideally are different from one another, wherein the layer thicknesses have to be determined at a high degree of freedom and realized with high precision. The mechanical and dynamic characteristics of the MEMS structure may be optimized by exactly determining the parameters and, thus in particular the layer thicknesses.

Conventional methods for realizing microscanners using piezoelectric actuators allow a difference in layer thickness between the actuators, the stiffening springs and the micromirror to be driven. The difference in layer thickness, however, is difficult to adjust as desired since the carrier layer of the actuators is limited in its maximum thickness by what is allowed by the coating process used, exemplarily thermal oxidation. In most cases, this is only a few micrometers. Actuators exhibiting these layer thicknesses, however, cannot achieve a high resonant frequency and stability. In addition, this method does not offer a way of implementing the stiffening springs arranged between the actuators and the torsion springs at an optimum thickness, since the manufacturing process is based only on a silicon layer which, separated by an oxide layer, is arranged on a substrate layer and the layer thickness of the silicon layer, except for the comparatively thin oxide layer, determines the maximum thickness of the stiffening springs. Due to the presence of only two material layers and the oxide layers, removing individual material layers for implementing areas of different thicknesses allows only a limited number of regions of different thicknesses.

The course of such a process is illustrated in FIG. 9.

Another method, described in FIG. 10, offers a way of providing a difference in layer thickness between the actuators and the mirror relatively easily. The actuators which are to be implemented to be thin are pre-etched in a time-controlled manner by back-side etching, wherein the mirror to be implemented to be comparatively thicker is subsequently etched further together with the pre-etched actuators. Using this method, the layer thicknesses of the actuators may be adjusted as desired, since the carrier layer is made of silicon and may thus be brought to relatively any layer thickness during an etching process. The precision of the layer thicknesses over the lateral extensions of the layers and the angle of the etching edge, however, are difficult to ensure, due to the inhomogeneous etching rate over the entire wafer. Thus, this method is suitable only for adjusting layer thicknesses in the mechanically passive regions, exemplarily the mirror or the stiffening springs. The method cannot be used for mechanically active regions, like torsion springs, the characteristics of which, in particular the natural frequency and permanent stressability, are influenced and determined by the layer thickness, due to the imprecisions mentioned before, since the layer thickness of the torsion spring which necessarily must be calculated precisely cannot be realized.

FIG. 11 shows another method for manufacturing electrostatically operated elements, exemplarily an SOI (Silicon on Insulator) wafer which consists of two silicon layers of equal layer thicknesses between which the functional layers are arranged. The method includes patterning and forming the layers from a top side of the SOI wafer towards a back side of the SOI wafer. However, this technology is not suitable for piezoelectric actuators. The functional layers for piezoelectric drives, piezoelectric layers and electrodes are ideally arranged on the topmost surface. Since it is of advantage for piezoelectric materials for the coating process to be performed on unpatterned wafers, pre-patterning from the top side where the functional layers are arranged is counterproductive.

Another example of a method for manufacturing MEMS elements comprising electrostatic drives includes a step of bonding together a patterned wafer with a second abraded wafer and subsequently coating and patterning the stack from a main side. A thickness of the wafer may be adjusted by abrading the second wafer. Since, however, piezoelectric actuators are necessitated to exhibit layer thicknesses of some micrometers, wafers would have to be abraded down to such a small thickness. Using this method, piezoelectric actuators in MEMS elements can only be manufactured at inadequate cost. In addition, adjusting the two wafers to be bonded to each other is difficult and increases the complexity of the manufacturing process.

Consequently, what would be desirable is an MEMS structure the individual components of which exhibit mutually different thicknesses and may be manufactured (cost) effectively.

SUMMARY

According to an embodiment, an MEMS structure may have: a stack having a substrate, a first etch-stop layer, a first semiconductor layer, a second etch-stop layer, a second semiconductor layer which are arranged one above the other in the order mentioned; a spring-and-mass system formed in the stack having at least one spring and an element suspended via the spring; and wherein the spring-and-mass system varies in thickness by removing, starting from a back side of the substrate facing away from the first etch-stop layer: the substrate while leaving the first semiconductor layer; and the substrate, the first etch-stop layer and the first semiconductor layer, at laterally different positions.

According to another embodiment, an MEMS structure may have: a stack having a substrate, a first etch-stop layer, a first semiconductor layer, a second etch-stop layer, a second semiconductor layer which are arranged one above the other in the order mentioned; a spring-and-mass system formed in the stack having at least one spring and an element suspended via the spring; and piezoelectric actuator layers which are arranged on the second etch-stop layer such that the second semiconductor layer is arranged between the second etch-stop layer and the piezoelectric actuator layers; wherein the spring-and-mass system varies in thickness by removing, starting from a back side of the substrate facing away from the first etch-stop layer: the substrate while leaving the first semiconductor layer; and the substrate, the first etch-stop layer and the first semiconductor layer, at laterally different positions such that a) the first etch-stop layer or the first semiconductor layer and b) the second etch-stop layer or the second semiconductor layer form a back side of the stack; and wherein the piezoelectric actuator layers are arranged on a planar and unpatterned surface of an insulation layer such that, in an actuator region where the piezoelectric actuator layers are arranged, starting from the piezoelectric actuator layers towards the back side of the stack, the layers present in this direction are arranged with no interruption therebetween.

According to still another embodiment, a method for manufacturing an MEMS structure with a stack of material thicknesses may have the steps of: providing a stack of a substrate, a first etch-stop layer, a first semiconductor layer, a second etch-stop layer and a second semiconductor layer which are arranged one above the other in the order mentioned; implementing a spring-and-mass system formed in the stack and varying in its thickness, having at least one spring and an element suspended via the spring by: removing: the substrate while leaving the first semiconductor layer; and the substrate, the first etch-stop layer and the first semiconductor layer, at laterally different positions, starting from a back side of the substrate facing away from a first etch-stop layer.

The central idea of the present invention is having recognized that the above object may be achieved by forming a stack made of at least one substrate and two semiconductor layers including etch-stop layers therebetween and removing different layers from the back side, thus implementing a spring-and-mass system the system varying in its thickness.

In accordance with one embodiment, a stack made of one silicon and two polysilicon layers is formed, wherein an oxide layer each is arranged between the layers and the silicon layer serves as a substrate. Before implementing springs and mass of the spring-and-mass system, the piezoelectric functional layers are arranged on a planar main side of the stack and an etch-stop layer of locally varying layer thickness is implemented. The device may be manufactured at high precision such that the parameters, such as, for example, resonant frequencies, may be adjusted precisely and in a reproducible manner.

BRIEF DESCRIPTION OF THE DRAWINGS

Embodiments of the present invention will be detailed subsequently referring to the appended drawings, in which:

FIG. 2 shows a sectional view of a stack comprising several layers;

FIGS. 3a-e show the individual steps of arranging different layers to form a stack;

DETAILED DESCRIPTION OF THE INVENTION

Figure 1A:
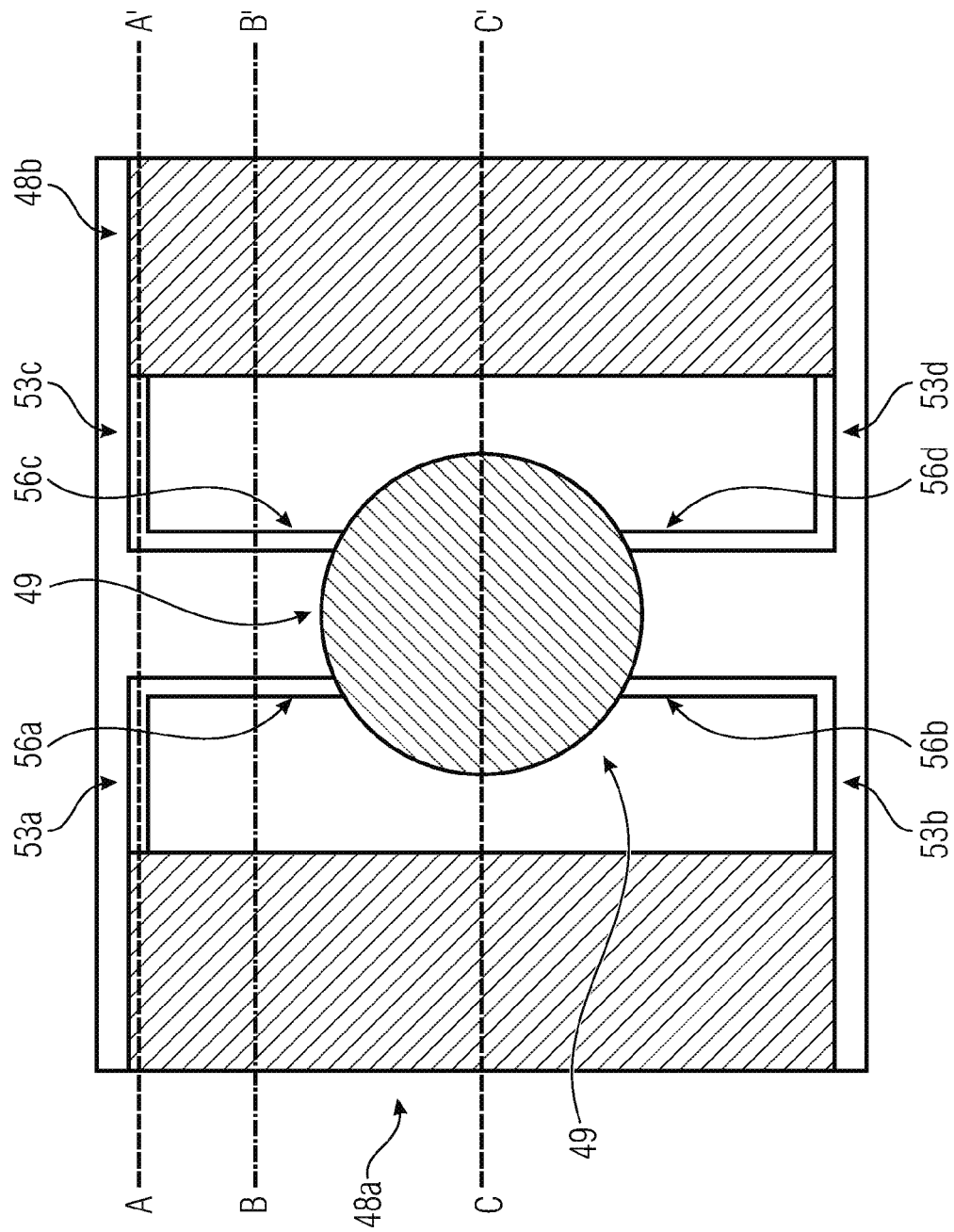
FIGS. 1a-b show a top view and sectional views of an MEMS structure comprising a vibratably suspended micromirror.

FIG. 1a shows a top view of an MEMS structure comprising a micromirror 49 suspended at actuators 48a and 48b via torsion springs 56a-d and stiffening springs 53a-d. The broken lines A-A', B-B' and C-C' illustrate sectional planes for which FIG. 1b describes the setup of the MEMS structure in cross-section.

Figure 1B:
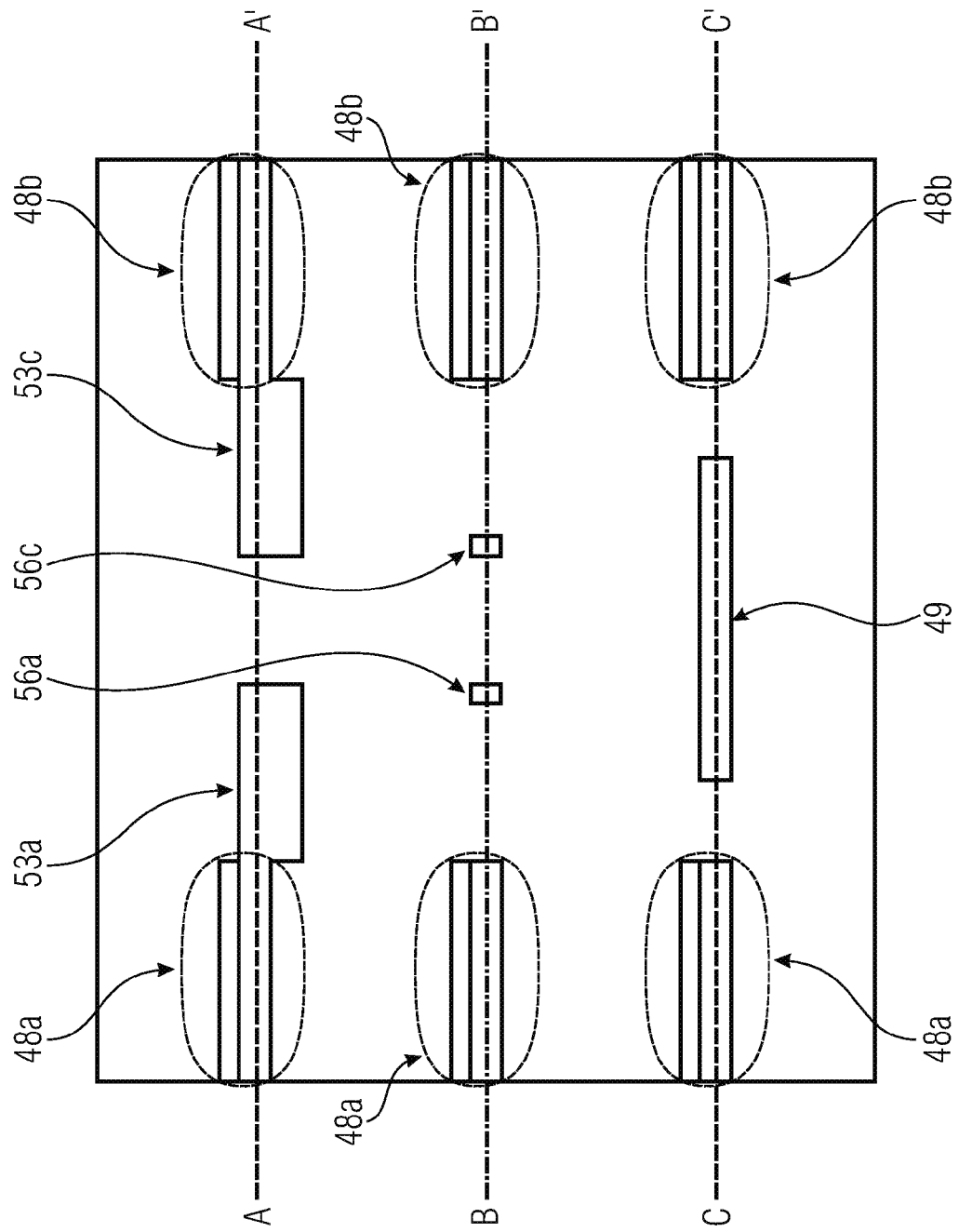

FIG. 1b, for the sectional plane A-A', shows the actuators 48a and 48b and the stiffening springs 53a and 53c which, compared to the actuators 48a and 48b, comprise a greater thickness. For the sectional plane B-B', FIG. 1b shows the torsion springs 56a and 56c which, compared to the stiffening springs 53a and 53c, comprise a smaller thickness. The result is that the torsion springs 56a and 56c are more compliant towards movements induced by the actuators 48a and 48b than the stiffening springs 43a and 54c. For the sectional plane C-C', FIG. 1b shows the micromirror 49 arranged between the actuators 48a and 48b. Same comprises roughly the same thickness as the torsion springs 56a and 55c and the actuators 48a and 48b.

In the sectional plane C-C', FIG. 2 shows providing a stack 12 comprising a substrate 14 which is exemplarily formed of a silicon layer. On a main side of the substrate 14 which defines a top side of the substrate 14, a first etch-stop layer 22 is arranged, on the surface of which facing away from the substrate 14 is arranged a first semiconductor layer 24. The main side of the first semiconductor layer 24 facing away from the first etch-stop layer 22 is covered by a second etch-stop layer 26 on the main side of which facing away from the first semiconductor layer 24 is arranged the second semiconductor layer 28. On a main side facing away from the substrate 14, which defines a top side of the stack 12, the stack 12 provided is covered by an insulating layer, exemplarily a non-conductive etching layer, 32. The first and second semiconductor layer 24 and 28 of the stack 12 provided may exemplarily be formed of polysilicon, whereas the first and second etch-stop layers 22 and 26 may possibly consist of silicon oxide. The insulation layer is formed of electrically non-conductive materials, preventing electrical contact from the first electrodes 36a and 36b to the second semiconductor layer 28.

The thicknesses of the first semiconductor layer 24 and the second semiconductor layer 28 are mutually different and selected as is necessitated by the thickness of individual components of the MEMS structure to be. During a later etching process, a thickness of an etch-stop layer is eroded considerably slower than is a semiconductor layer of comparable thickness. Masking lateral positions of a semiconductor layer allows removing regions of the respective semiconductor layer which are not covered by the mask, whereas regions covered by the mask are not eroded, since the etching process removes the comparably thin etch-stop mask only very slowly. Functional layers can be separated from one another by masking using a mask of minimum thickness varying over the lateral extension. When removing the minimum thickness of the etch-stop layer, what remains is residual axial extensions in the sense of an etch-stop mask, preventing the masked regions from being removed. Masking of the oxide layers may particularly be done such that etch-stop regions resembling islands are formed.

In its lateral course, the first etch-stop layer 22 comprises a region 34 along the lateral extension of which the first etch-stop layer 22 has a greater thickness than in the remaining lateral course of the stack 12. The change in the layer thickness of the first etch-stop layer 22 in the region 34 here is implemented in steps. The first semiconductor layer 24 arranged on the first etch-stop layer also has a varying layer thickness over a lateral extension of the layer 24, wherein the first semiconductor layer 24 in the region 34 is implemented to be thinner, in steps, to a degree to which the first etch-stop layer 22 in the region 34 is implemented to be thicker such that a main side of the first semiconductor layer facing away from the first etch-stop layer 22 is formed to be planar. The further layers 26, 28 and 32 also comprise planar surfaces.

The stack 12 serves as a starting work piece for the following method steps. The consecutive arrangement of the individual layers one above the other is illustrated below in FIG. 3.

FIG. 3a, in the sectional plane C-C', shows the arrangement of the substrate 14, and the arrangement of the first etch-stop layer 22 on a main side of the substrate 14 defining the top side. With its main side opposite the top side of the substrate, the substrate 14 forms the back side of the consecutively formed stack 12.

Subsequently, main sides of a layer or the stack 12 which are arranged to be facing away from the back side of the stack 12 are referred to as top sides, and main sides of a layer facing the back side of the stack 12 are referred to as back sides. These terms serve clarity without defining orientation of the stack or its layers in space or in an arrangement.

The first etch-stop layer 22 is arranged on the substrate such that a step-type increase in the layer thickness is implemented in the region 34, thus arranging a masking, or mask. Thus, a mask for subsequent etching processes is formed. A thermal oxidation process may exemplarily be used for arranging the first etch-stop layer 22.

Figure 3B:
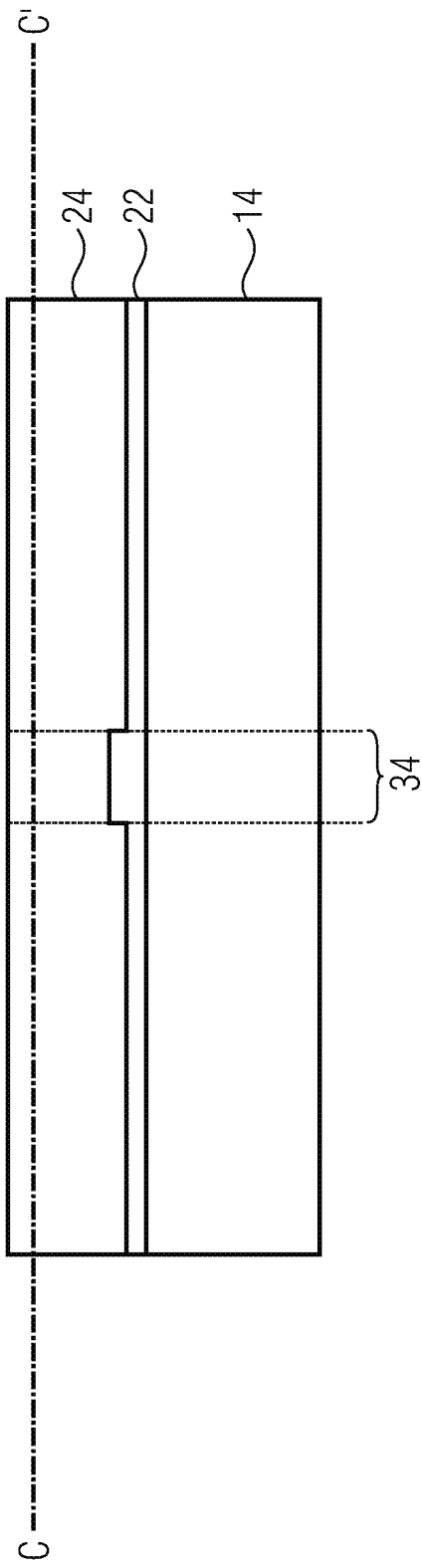

FIG. 3b, in the sectional plane C-C', shows the subsequent step of arranging the first semiconductor layer on the top side of the first etch-stop layer 22. Arranging may exemplarily be performed by an epitaxy method. The step-type uneven implementation of the first etch-stop layer 22 is compensated by arranging the first semiconductor layer such that the top side of the first semiconductor layer 24 is implemented to be planar. In the region 34 of the first semiconductor layer 24, this procedure results in the first semiconductor layer 24 in the region 34 to be implemented at a smaller thickness than in its remaining lateral extension. Arranging the masking by the first etch-stop layer 22 is not of relevance for arranging the further following layers in that the further layers may be placed on a planar surface. This means that the further process steps are simplified considerably compared to existing methods which entail masking on an external main side of a semiconductor or substrate layer to be etched. Functional layers to be arranged, for example, for actuators may be arranged on planar wafer surfaces. When a surface of a stack is implemented to be uneven due to masking, this increases the complexity of arranging the functional layers.

Figure 3C:
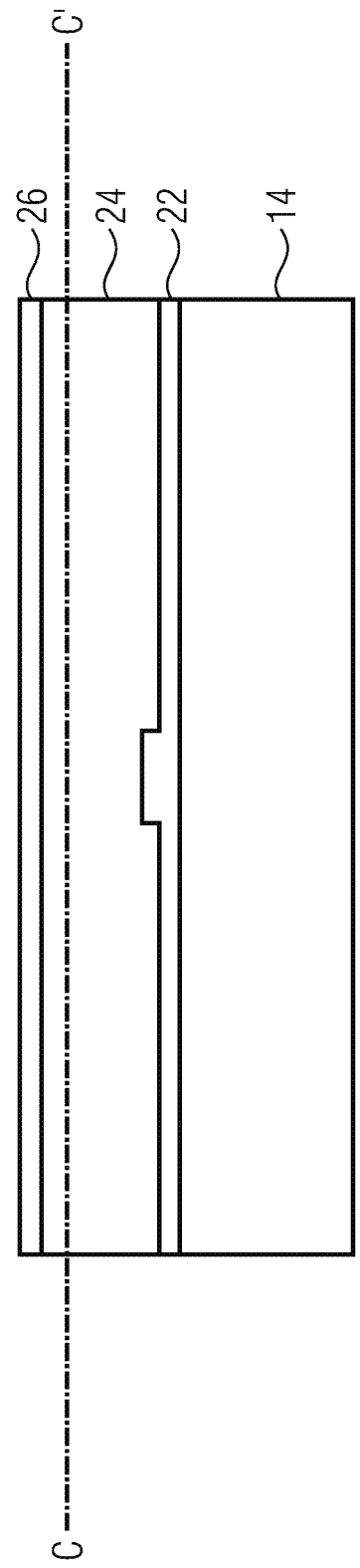

FIG. 3c, in the sectional plane C-C', shows the arrangement of the second etch-stop layer 26 on a top-side of the first semiconductor layer 24.

Figure 3D:
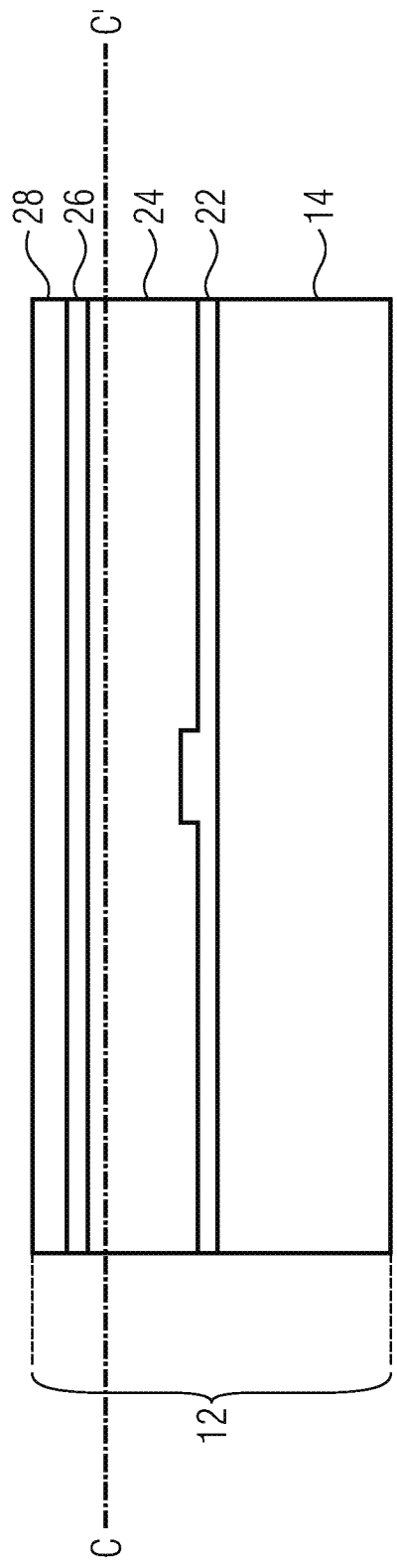

FIG. 3d, in the sectional plane C-C', shows the arrangement of the second semiconductor layer 28 on a top side of the second etch-stop layer 26. The second semiconductor layer 28 here is arranged at a layer thickness differing from the first semiconductor layer 24, wherein in principle it is also conceivable for the first semiconductor layer 24 and the second semiconductor layer 28 to exhibit identical layer thicknesses. after having arranged the layers, the substrate 14, the first etch-stop layer 22, the first semiconductor layer 24, the second etch-stop layer 26 and the second semiconductor layer 28 form the stack 12, which is provided for the following steps.

Figure 3E:
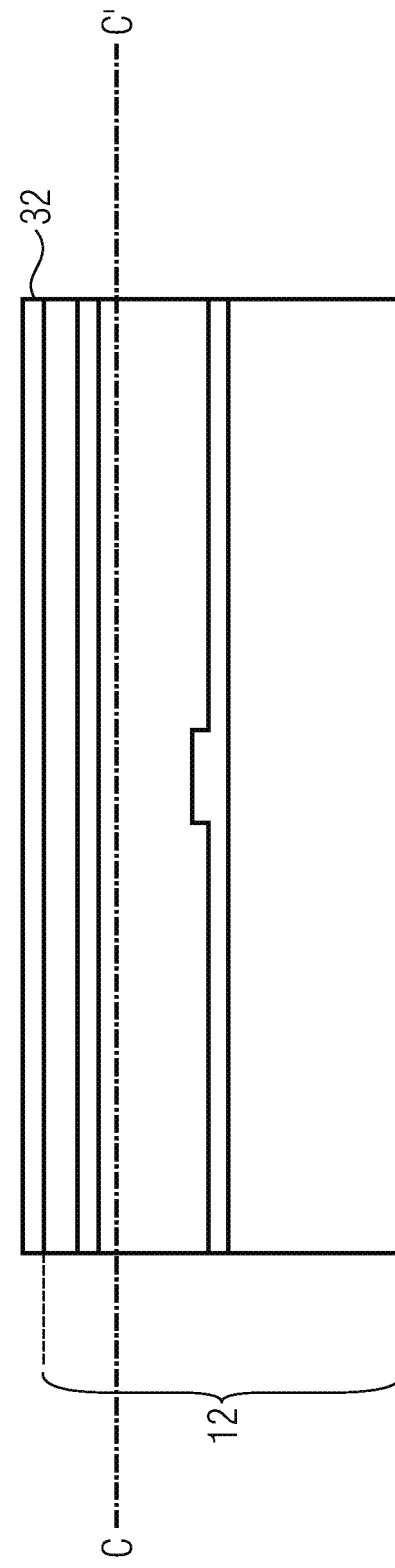

FIG. 3e, in the sectional plane C-C', shows the arrangement of the insulation layer 32 over the lateral extension of the stack 12 so as to allow functional layers to be arranged consecutively.

Figure 4:
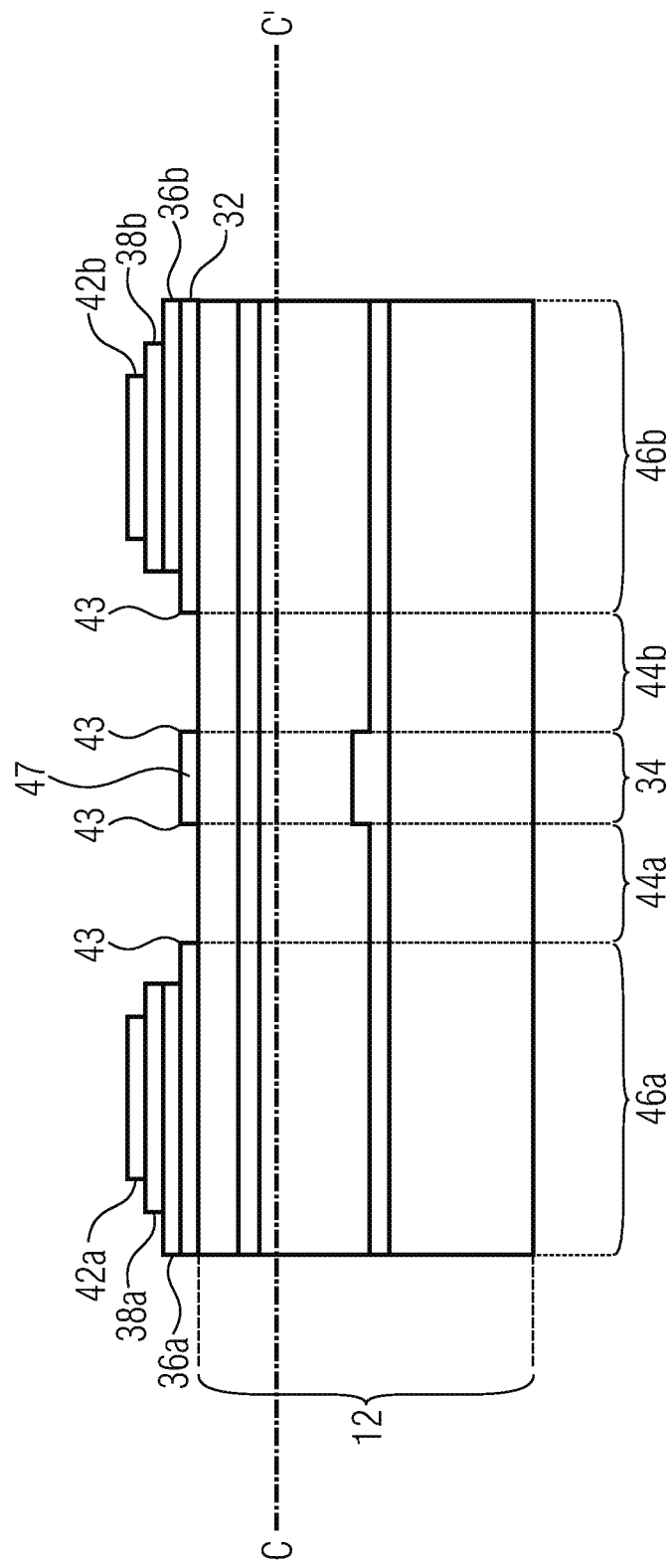
FIG. 4 shows the arrangement of actuators on the stack.

FIG. 4, in the sectional plane C-C', shows the method step of arranging first electrodes 36a and 36b, piezoelectric material 38a and 38b and second electrodes 42a and 42b on the stack 12, or a top side of the insulation layer 32. First electrodes 36a and 36b, piezoelectric material 38a and 38b and second electrodes 42a and 42b are arranged one after the other on the top side of the insulation layer 32. The arrangement of the electrodes 36a, 36b, 42a and 42b takes place such that the piezoelectric material 38a is arranged between the first electrode 36a and the second electrode 42a and the piezoelectric material 38b is arranged between the first electrode 36b and the second electrode 42b. Thus, the second electrode 42a, and 42b, is arranged relative to the first electrode 36a and 36b, respectively, such that the second electrode 42a, and 42b, does not contact the first electrode 36a and 36b, respectively, thus preventing short-circuiting. Furthermore, the insulation layer 32 is subdivided into several lateral regions 44a, 44b, 46a and 46b by patterning 43. The patterning 43 may exemplarily be performed by severing or cutting through the insulation layer 32. The regions 44a and 44b here are regions to be exposed, whereas the regions 46a and 46b are implemented to be actuator regions.

The insulation layer 32 is removed in the regions to be exposed 44a and 44b and the region 34, exemplarily by means of a grinding or etching process. Subsequently, a reflection layer 47 is arranged on the top side of the second semiconductor layer 28, in the region 34 where a movable structure will be implemented later on. This may exemplarily include an aluminum or a silver layer in order to reflect incident light power, for example a laser beam. When employing the structure formed by the stack 12 for a non-optical application, a reflecting surface may be omitted.

Figure 5:
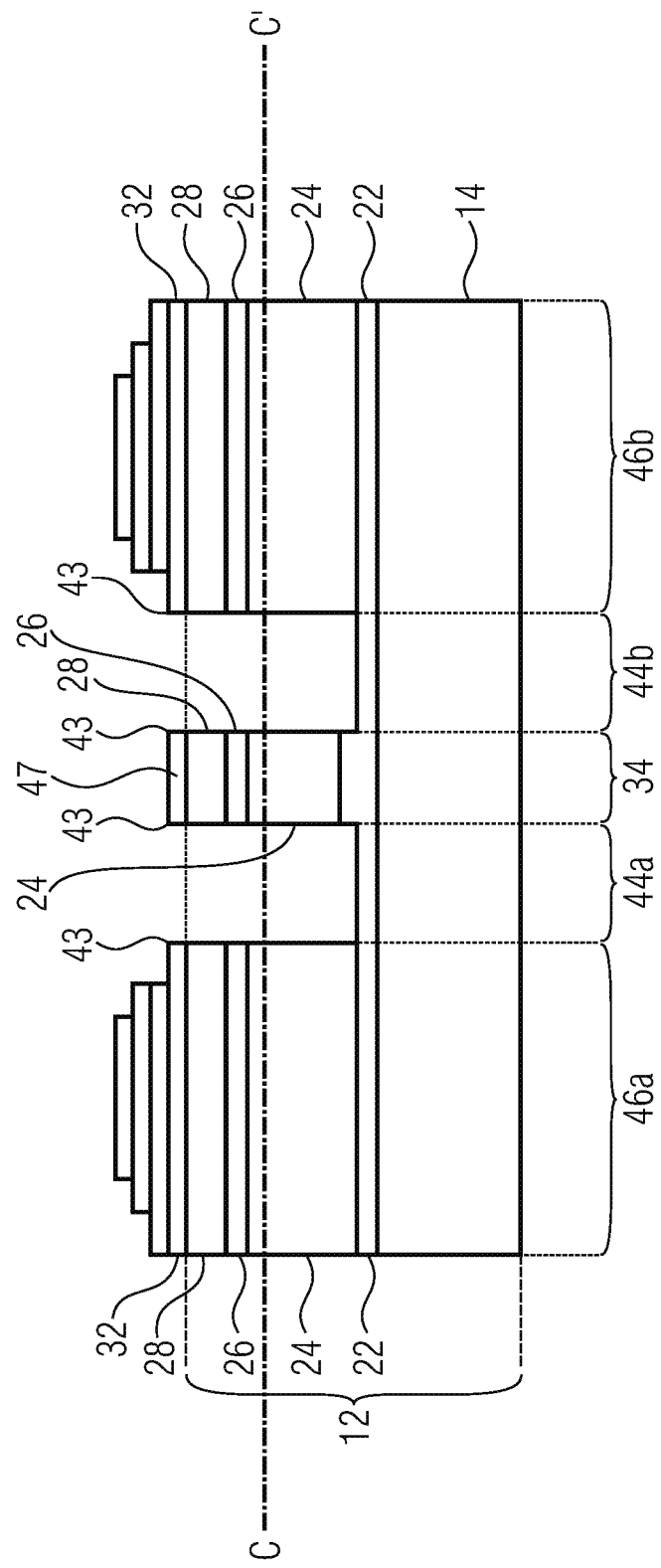
FIG. 5 shows a locally selective removal of layers from a top side of the stack.

FIG. 5, in the sectional plane C-C', shows removing the second semiconductor layer 28, the second etch-stop layer 26 and the first semiconductor layer 24 in the regions to be exposed 44a and 44 starting from the top side of the second semiconductor layer 28. Removing may exemplarily be performed by an etching process. After having removed the layers starting from a top side of the stack, the first semiconductor layer 24, the second etch-stop layer 26, the second semiconductor layer 28 and the insulation layer 32 are severed in the lateral direction along the course of the patterning 43, the reflection layer 47 being arranged in the region 34 on the second semiconductor layer.

Figure 6:
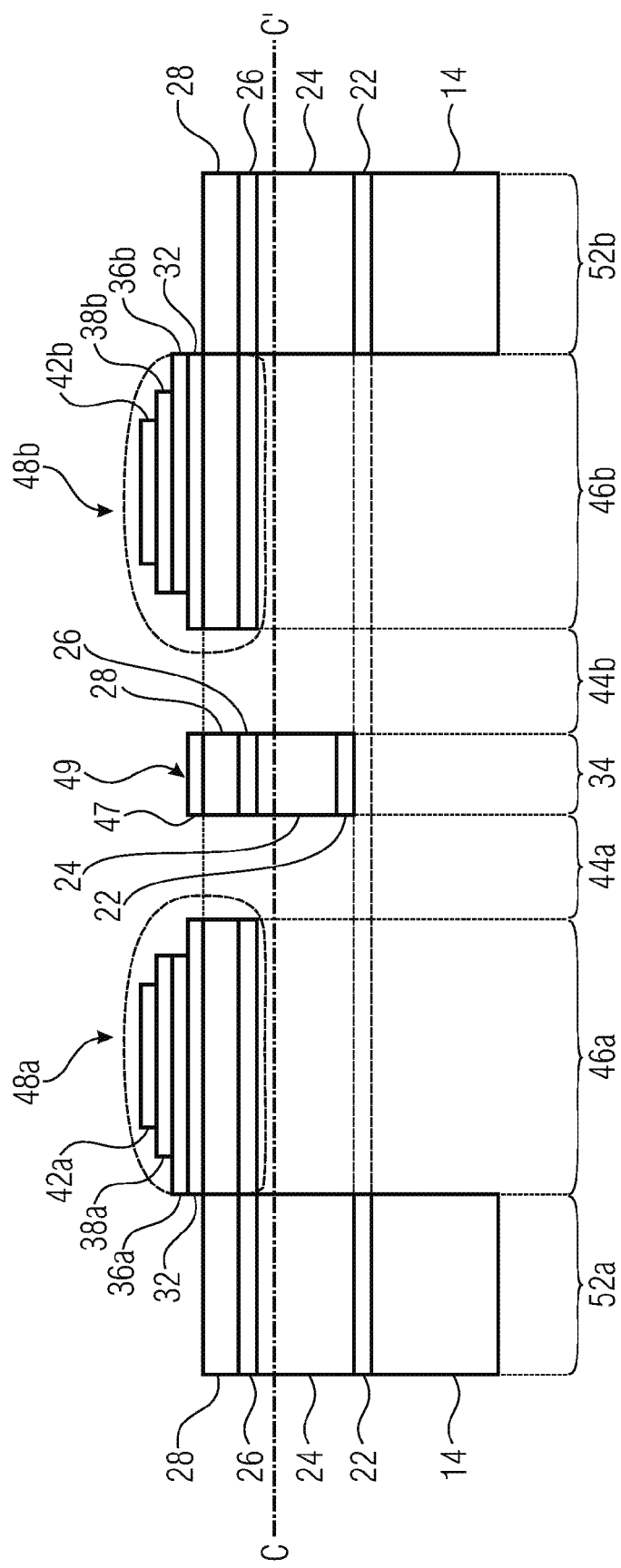
FIG. 6 shows a locally selective removal of layers from a back side of the stack.

FIG. 6, in the sectional plane C-C' shows the step of removing the substrate 14, the first semiconductor layer 24 and parts of the first etch-stop layer 22 starting from the back side of the stack. An etching process which at first removes the substrate 14 over the entire area in the regions 46a, 46b, 44a, 44b and 34 may be used here for removing. Subsequently, the first etch-stop layer 22 is eroded or etched away in these regions. When the first etch-stop layer 22 has been removed in regions 46a, 44a, 44b and 46b, the regions 44a and 44b are completely exposed in an axial direction. In the regions 46a and 46b, non-existence of the etch-stop layer 22 causes the removal, for example the etching process, to consecutively attack the first semiconductor layer 24. Due to the masking and thus the presence of part of the first etch-stop layer 22 in an axial course of the region 34, however, the first semiconductor layer 24 is still covered by the first etch-stop layer 22 from the back side of the stack. By continuing the etching process, the first semiconductor layer is removed in the regions 46a and 46b in the further course of the method, whereas the first etch-stop layer 22 will partly remain in the region 34 and removing the first semiconductor layer 24 in the region 34 is prevented. By partly removing the layers in the actuator regions 46a and 46b, the second etch-stop layer 26, the second semiconductor layer 28 and the insulation layer 32, the first electrodes 36a and 36b, the piezoelectric materials 38a and 38b and the second electrodes 42a and 42b will remain in the axial courses of the actuator regions 46a and 46b.

These layers remaining in the regions 46a and 46b form the actuators 48a and 48b. Thus, the actuators 48a and 48b are implemented such that applying an electrical voltage between the first electrode 36a and 36b and the second electrode 42a and 42, respectively, results in the piezoelectric material 38a and 38b, respectively, to be deformed. This deformation, exemplarily a contraction, of the piezoelectric material 36a and 36b results in a deflection of the layers arranged at the first electrode, which then behave like a bending beam. Thus, the actuators 48a and 48b are supported at the peripheral region 52a and 52b. The regions 52a and 52b here may be part of the initial stack or arranged afterwards. They are implemented to form an anchor point of the spring-and-mass system formed by the preceding method steps. The remaining layers in the axial course of the region 34 form the micromirror 49 with the reflection layer 47.

Figure 7:
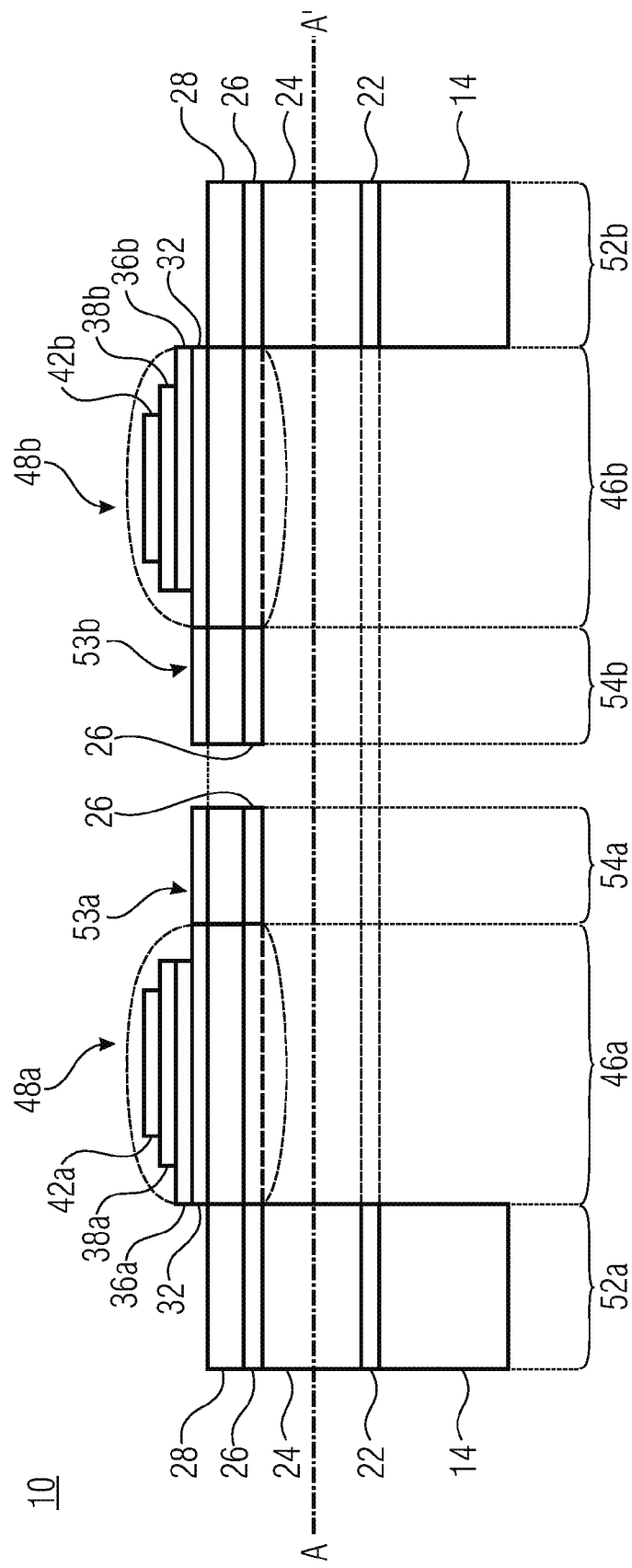
FIG. 7 shows a locally selective removal of material layers from a back side of the stack in an alternative sectional plane.

FIG. 7 shows an alternative MEMS structure 10 manufactured by means of the method described in the sectional plane A-A'. In the actuator regions 46a and 46b, the substrate 14, the first etch-stop layer 22, the first semiconductor layer 24 and the second etch-stop layer 26 have been removed by back-side removal. In the stiffening spring regions 54a and 54b, the second etch-stop layer 26 is still there such that stiffening springs 53a and 53b of the MEMS structure comprise a greater thickness compared to the actuators 48a and 48b, while neglecting the electrodes and piezoelectric functional layers. The second etch-stop layer 26 has been removed in the actuator regions 46a and 46b by the locally selective method, and in the region between the stiffening spring regions 54a and 54b.

Figure 8A:
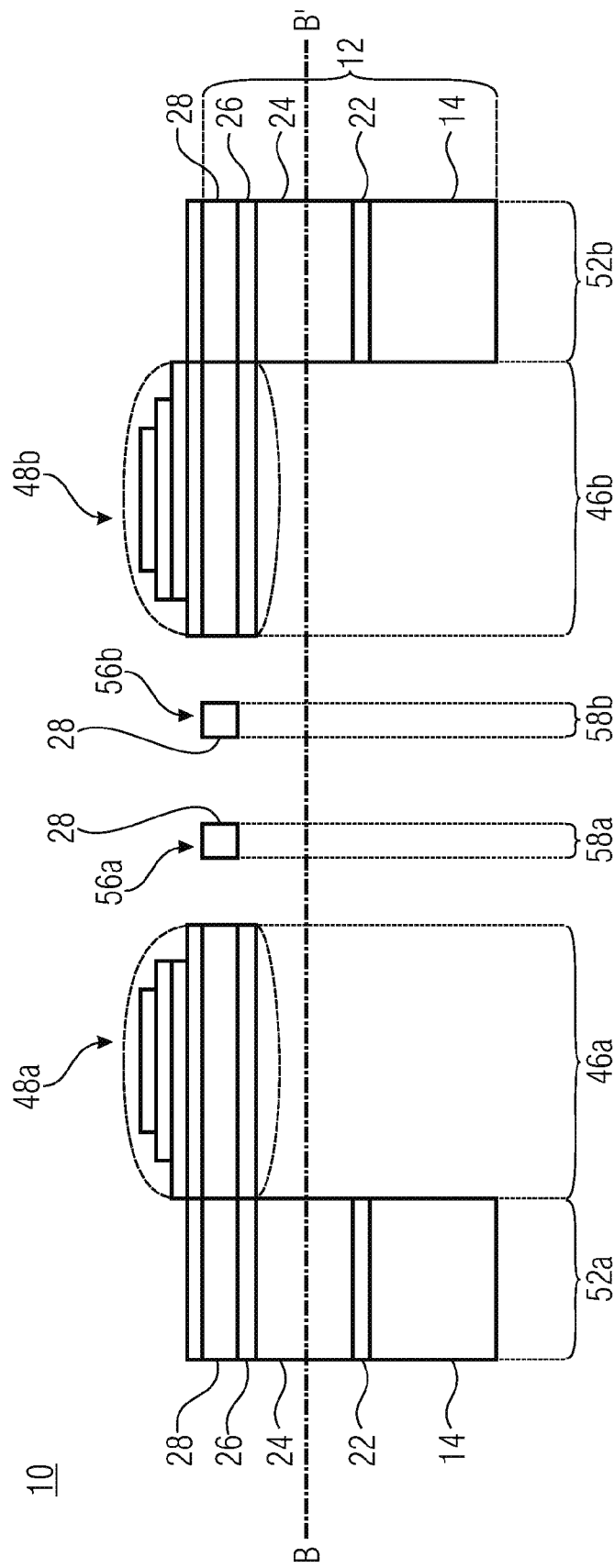
FIGS. 8a-b show a locally selective removal of material layers from a back side of the stack in another sectional plane.

FIG. 8A shows a sectional view of the MEMS structure 10 in the sectional plane B-B' in which torsion springs 56a and 56b are illustrated in the torsion spring regions 58a and 58b. In the torsion spring regions 58a and 58b, all of the other layers of the stack, except for the second semiconductor layer 26, have been removed, wherein exemplarily the torsion springs 56a and 56b are formed by selectively etching from the back side of the stack 12.

Figure 8B:
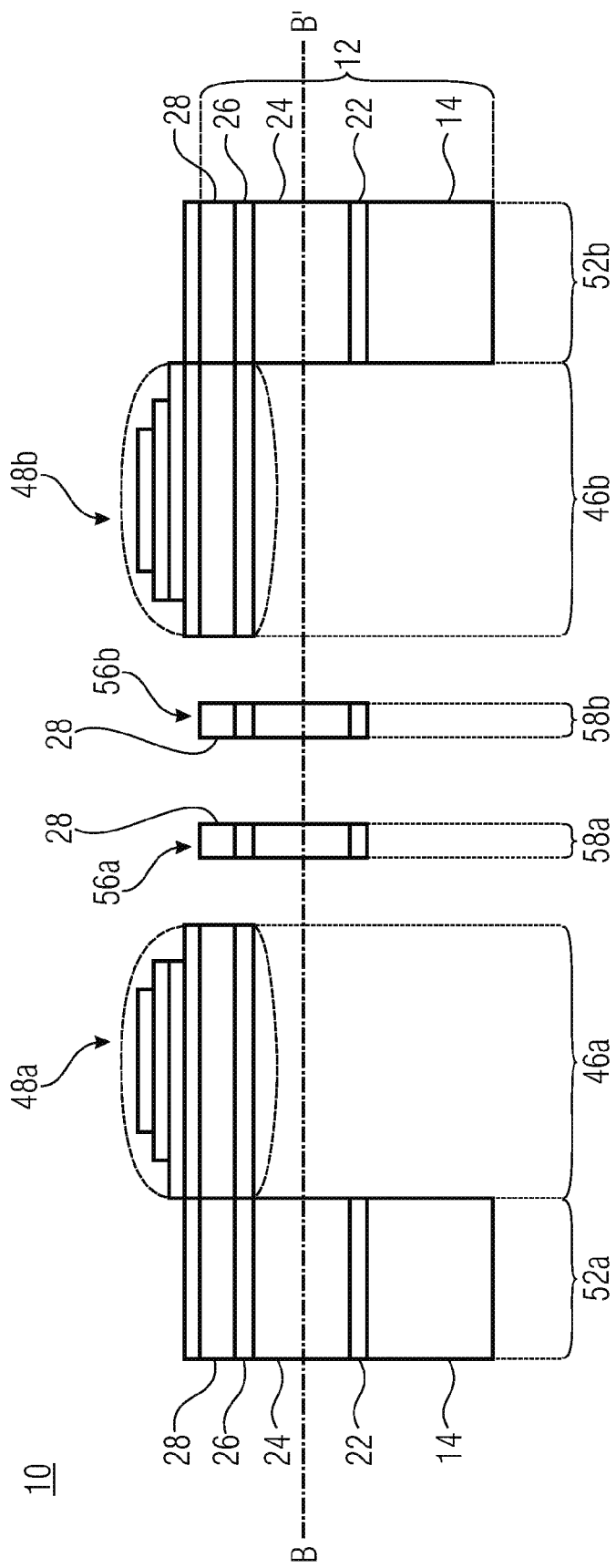
Figure 9:
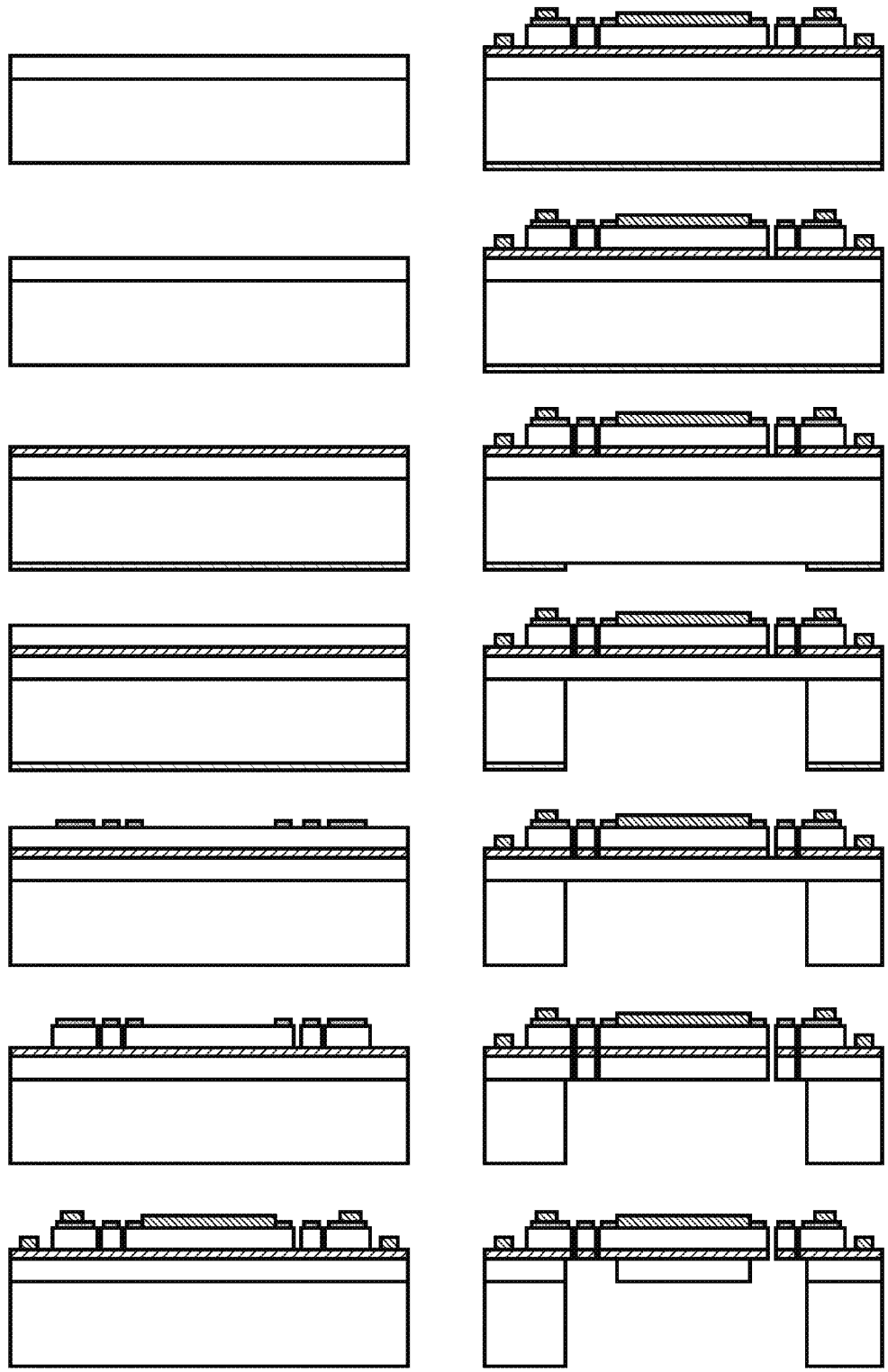
FIG. 9 shows a known method for manufacturing an MEMS structure by back-side etching.
Figure 10:
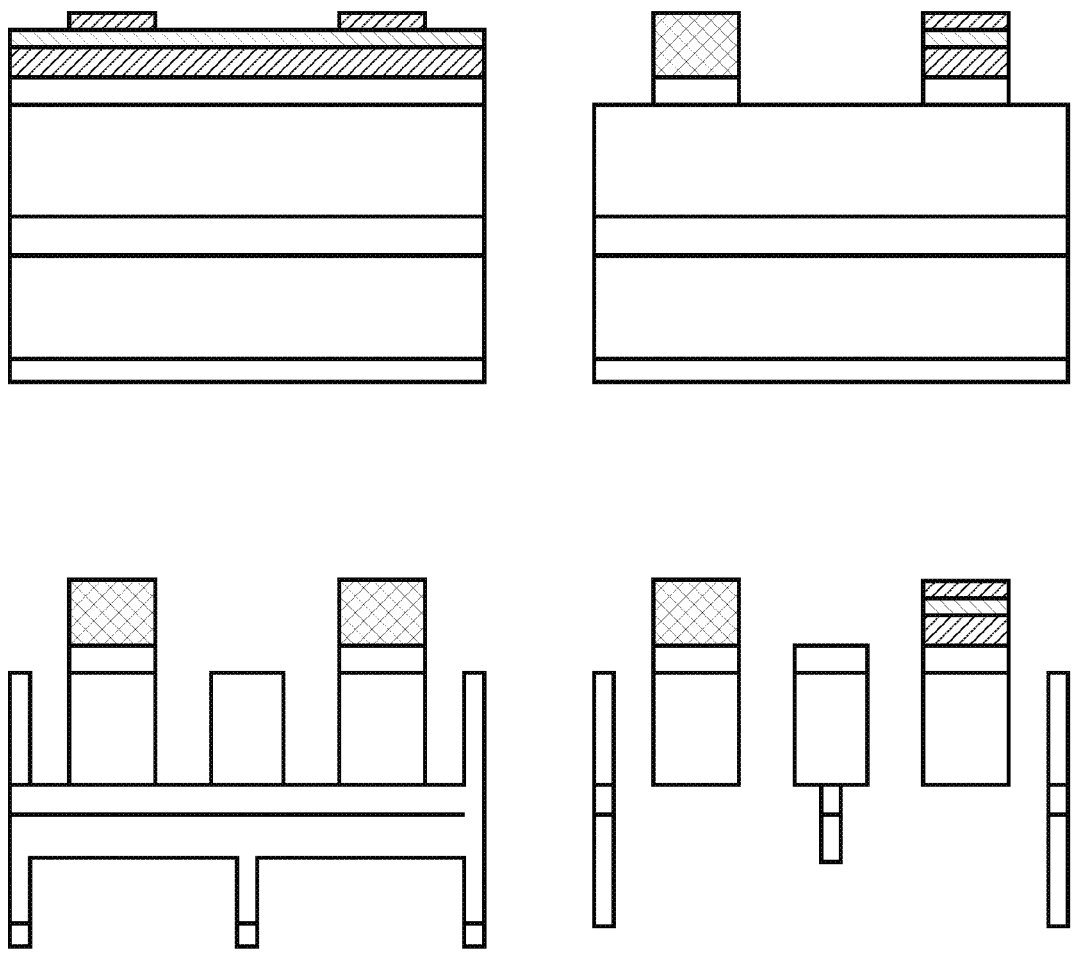
FIG. 10 shows an alternative known method for manufacturing an MEMS structure by time-controlled pre-etching.
Figure 11:
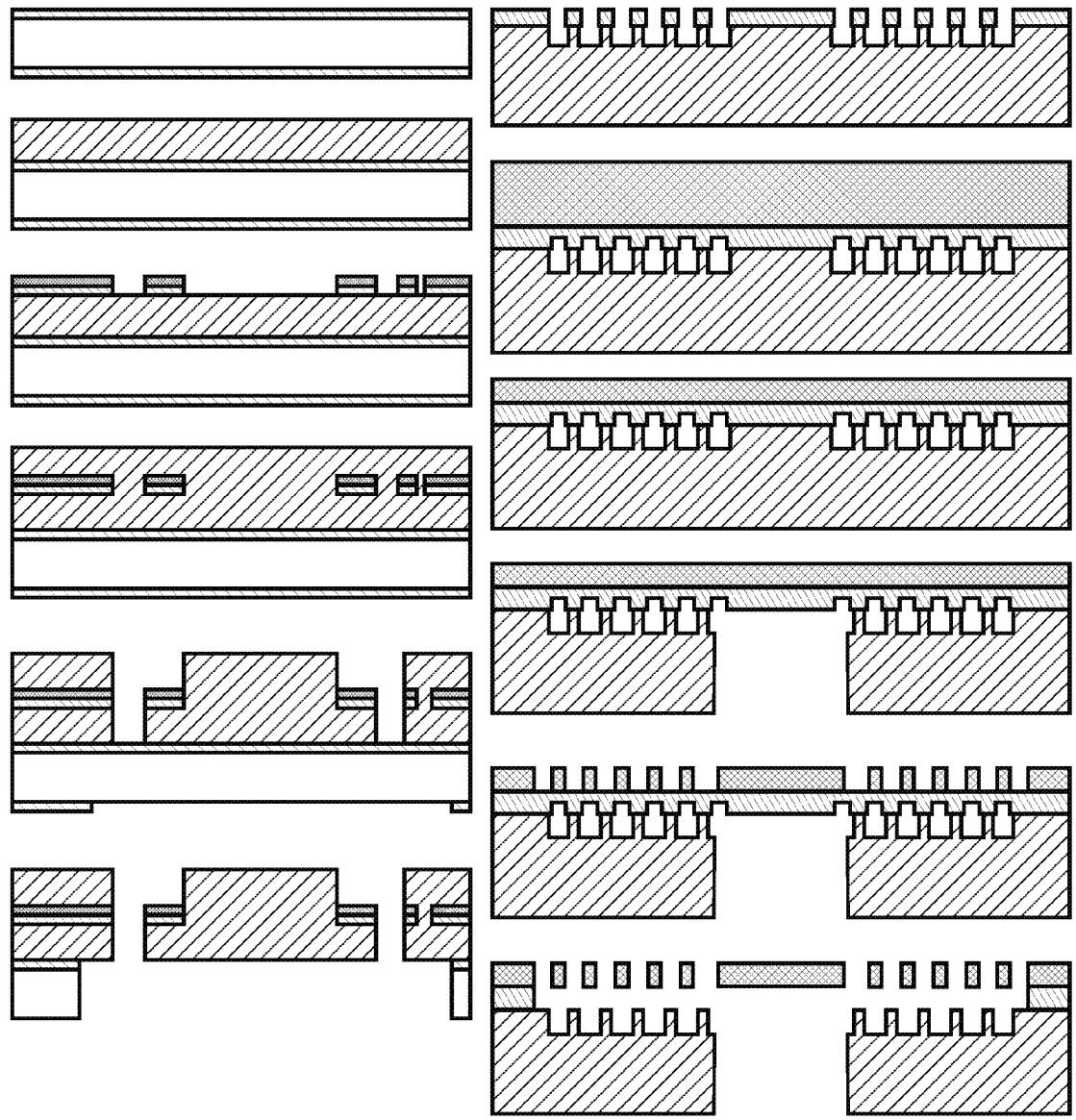
FIG. 11 shows another known method for manufacturing an MEMS structure.

Although in FIG. 8A the torsion springs 56a and 56b are formed only by the second semiconductor layer 28, it is also conceivable for the second etch-stop layer 26, the first semiconductor layer 24 or the first etch-stop layer 22 each including the respective layers arranged above them in the stack to remain while removing layers from the back side of the stack as shown in FIG. 8B. In principle, different sequences of layers could be removed at different positions over the lateral extension and in different sectional planes of the layers.

Although the stack of material layers in the preceding embodiments has included the first and second semiconductor layers, it is also possible for the stack to be formed of several semiconductor layers with and/or without any etch-stop layers arranged therebetween.

In particular, the manufacturing method of the preceding embodiments allows manufacturing an MEMS structure which comprises a mutually different layer thickness in the regions of the torsion springs 58a and 58b and the regions of the stiffening springs 54a and 54b.

The dynamic characteristics of the overall system may be adjusted very well by specially implementing the thicknesses of actuators, stiffening springs, torsion springs and mirror elements. Limitations of existing methods as described before may be bypassed by means of the method described above.

Although the preceding embodiments describe manufacturing an MEMS structure comprising a vibratably suspended micromirror, other MEMS structures, exemplarily mechanical microdrives, may also be manufactured using the method described.

In other words, the geometry of MEMS structures is of high importance for the overall performance thereof. Thus, it is practical to construct different parts of a structure at different layer thicknesses, depending on the function assigned. The process method described by the embodiments allows precise definition and, at the same time, a broadly realizable range of layer thicknesses of the different layer thicknesses in an MEMS structure.

A time-controlled etching process is not sufficient in order to allow certain layer thicknesses at the desired positions. For the process method described in the embodiments, double polysilicon layers arranged on a substrate are used instead of normal SOI wafers. An oxide layer functioning as an etch stop or back-side etching each is arranged between two polysilicon layers and between a polysilicon layer and a silicon layer of a substrate. The wafer is etched locally during back-side etching by masking the etch-stop layers. Thus, the layer thicknesses of the MEMS structure are defined using the thicknesses of the polysilicon layers and the thicknesses of the etch-stop layers such that both the layer thicknesses in different lateral regions and the outline of these regions may be adjusted precisely.

Being able to manufacture an MEMS structure with several, different layer thicknesses increases the degrees of freedom when designing the structures considerably. Being able to mask the oxide layers between individual polysilicon and/or silicon layers, thus comprising a variable layer thickness, wherein the surface of the stack of layers will nevertheless comprise a planar surface, allows depositing piezoelectric functional layers onto the topmost layer of the stack, which increases the quality of the manufacturing process considerably.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for manufacturing an MEMS structure with a stack of material thicknesses, comprising:
   providing a stack of a substrate, a first etch-stop layer, a first semiconductor layer, a second etch-stop layer and a second semiconductor layer which are arranged one above the other in the order mentioned;
   implementing a spring-and-mass system formed in the stack and varying in its thickness, comprising at least one spring and an element suspended via the spring by:
   removing:
      the substrate while leaving the first semiconductor layer; and
      the substrate, the first etch-stop layer and the first semiconductor layer,
   at laterally different positions, starting from a back side of the substrate facing away from a first etch-stop layer;
   wherein providing the stack comprises:
   arranging the first or the second etch-stop layer such that the first or second etch-stop layer comprises a layer thickness varying over a lateral extension of the stack; and
   arranging the first or second semiconductor layer such that the main side of the first or second semiconductor layer facing away from the substrate forms a planar surface.

2. The method in accordance with claim 1, further comprising:
   arranging piezoelectric actuator layers on a planar and unpatterned insulation layer such that the second semiconductor layer is arranged between the second etch-stop layer and the piezoelectric actuator layers;
   wherein arranging the piezoelectric actuator layers is performed before implementing the spring-and-mass system varying in its thickness.

3. The method in accordance with claim 1, further comprising:
   arranging an actuator layer on a main side of the stack facing away from the substrate;
   removing the substrate or the substrate and the first semiconductor layer using selective etching so as to implement at least two spring elements in a thickness of the second and the first semiconductor layers or the second semiconductor layer including the first or second etch-stop layer or minus the latter.

4. The method in accordance with claim 3, wherein arranging the actuator layer is done using piezoelectric materials.

5. The method in accordance with claim 1, comprising between providing the stack and implementing the spring-and-mass system:
   removing:
      the second semiconductor layer while leaving the first semiconductor layer; or
      the second semiconductor layer, the second etch-stop layer and the first semiconductor layer;
   at laterally different positions, starting from a main side of the stack facing away from the substrate.

* * * * *